United States Patent
Hiura et al.

(10) Patent No.: US 8,093,580 B2
(45) Date of Patent: *Jan. 10, 2012

(54) SEMICONDUCTOR DEVICE AND METHOD OF MANUFACTURING THE SAME

(75) Inventors: Hidefumi Hiura, Minato-ku (JP); Satoru Toguchi, Minato-ku (JP); Tetsuya Tada, Tsukuba (JP); Toshihiko Kanayama, Tsukuba (JP)

(73) Assignee: NEC Corporation, Tokyo (JP)

( * ) Notice: Subject to any disclaimer, the term of this patent is extended or adjusted under 35 U.S.C. 154(b) by 188 days.

This patent is subject to a terminal disclaimer.

(21) Appl. No.: 12/515,384

(22) PCT Filed: Oct. 24, 2007

(86) PCT No.: PCT/JP2007/071159
§ 371 (c)(1),
(2), (4) Date: May 18, 2009

(87) PCT Pub. No.: WO2008/062642
PCT Pub. Date: May 29, 2008

(65) Prior Publication Data
US 2010/0051902 A1    Mar. 4, 2010

(30) Foreign Application Priority Data
Nov. 22, 2006  (JP) .................................. 2006-315050

(51) Int. Cl.
*H01L 33/00*  (2010.01)
(52) U.S. Cl. .................. 257/13; 257/40; 257/E33.061; 257/E33.655; 257/E51.018; 977/735; 977/949; 977/840; 977/750
(58) Field of Classification Search ............ 257/13, 257/40, E33.061, E51.018; 977/735, 750, 977/949
See application file for complete search history.

(56) References Cited

FOREIGN PATENT DOCUMENTS

| JP | 2597377 B2 | 1/1997 |
|---|---|---|
| JP | 11-505367 A | 5/1999 |
| JP | 2002-124387 A | 4/2002 |
| JP | 2002-305087 A | 10/2002 |
| JP | 2004-067413 A | 3/2004 |
| JP | 2004-311733 A | 11/2004 |
| JP | 2005-209736 A | 8/2005 |
| JP | 2006-190815 A | 7/2006 |
| JP | 2006-294667 A | 10/2006 |
| WO | 2004/009884 A1 | 1/2004 |

(Continued)

OTHER PUBLICATIONS

V. Derycke et al., "Controlling doping and carrier injection in carbon nanotube transistors", Applied Physics Letters, Apr. 15, 2002, pp. 2773-2775, vol. 80, No. 15.

(Continued)

*Primary Examiner* — Fernando L Toledo
*Assistant Examiner* — Mamadou Diallo
(74) *Attorney, Agent, or Firm* — Sughrue Mion, PLLC

(57) ABSTRACT

A semiconductor device has a structure in which a light-emitting layer of an organic material or the like is sandwiched between a work function controlled single-wall carbon nanotube cathode encapsulating a donor having a low ionization potential and a work function controlled single-wall carbon nanotube anode encapsulating an acceptor having a high electron affinity. A semiconductor device represented by an organic field-effect light-emitting element and a method of manufacturing the same are provided. The semiconductor device and the method of manufacturing the same make it possible to improve characteristics and performance, such as reduction in light-emission starting voltage and a high luminous efficiency, to improve reliability, such as an increase in life, and to improve productivity, such as reduction in manufacturing cost.

10 Claims, 8 Drawing Sheets

FOREIGN PATENT DOCUMENTS

WO    2005/083751 A2    9/2005
WO    2007/015710 A1    2/2007

OTHER PUBLICATIONS

JPO, pp. 1-68.

Marc Bockrath et al., "Chemical doping of individual semiconducting carbon-nanotube ropes", Physical Review B, Apr. 15, 2000, pp. R10-606-R10-608, vol. 61, No. 16.

R. Martel et al., "Ambipolar Electrical Transport in Semiconducting Single-Wall Carbon Nanotubes", Physical Review Letters, Dec. 17, 2001, pp. 256805-1-256805-4, vol. 87, No. 25.

Moonsub Shim et al., "Polymer Functionalization for Air-Stable n-Type Carbon Nanotube Field-Effect Transistors", Journal of American Chemical Society, 2001, pp. 11512-11513, vol. 123, No. 46.

In case where work function controlled SWNT electrode is used (B-1) zero-bias state  (B-2) flat band state  (B-3) $V_{bias} > \Delta W = E_g$ (A) Basic structure of EL element using work function controlled SWNT electrode (B) flat band state (C) $V_{bias} > \Delta W$

US 8,093,580 B2

SEMICONDUCTOR DEVICE AND METHOD OF MANUFACTURING THE SAME

TECHNICAL FIELD

This invention relates to a semiconductor device and a method of manufacturing the same and, in particular, to a field-effect self-luminous semiconductor device which is stable, high in injection efficiency, and low in power consumption and a method of manufacturing the same.

BACKGROUND ART

At first, description will be made about an organic electroluminescence (ElectroLuminescence: EL) element and single-wall carbon nanotubes (Single-Wall carbon Nano-Tubes: abbreviated to SWNTs) material, both of which are related to this invention.

First, the organic EL element is a kind of light-emitting diode driven by a direct current and is also called an organic electroluminescence element and an organic LED (Light-Emitting Diode). At any rate, the most basic structure of the organic EL element mostly is a sandwich structure such that a light-emitting layer (might be called a luminescent layer) formed of an organic compound is sandwiched by two electrodes, i.e., a cathode and an anode. A wide variety of proposals have been made about the light-emitting layer ranging from a single-layer structure to a multilayer structure. Depending on circumstances, each layer of the respective structures has a different function. In general, a hole-injection layer and a transport layer are laminated on an anode side while an electron-injection layer and a transport layer are laminated on a cathode side.

As regards the electrodes of the EL element, a transparent electrode is used as one of the electrodes so that light of the light-emitting layer can be extracted or emitted. In most cases, for the anode, use is made of a transparent metallic material which has a comparatively high work function and which is called ITO (Indium Tin Oxide, tin-doped indium oxide) or IZO (Indium Zinc Oxide, zinc-doped indium oxide).

According to Patent Document 1 (JP-B-2597377 (page 14, FIG. 1)), an anode material desirably has a work function of not less than 4 eV.

On the other hand, for the cathode, use is made of metal, such as calcium (Ca), aluminum (Al), and magnesium-silver (MgAg), which has a comparatively low work function. For a property of a cathode material, it is required to have a work function of not more than 4 eV, for example, as described in Patent Document 1.

An operating mechanism of the organic EL element is described in a number of documents. For example, the mechanism is described in Non-patent Document 1 ("Year of Heisei 17 [2005], Patent Application Technology Trend Research Report, Organic EL Element (abridged edition)", edited by the Japan Patent Office (the technology trend team of the technology research division of the general affairs department of the Japan Patent Office), April in Heisei 18 [2006], pp. 1-2). According to the report, in an organic EL element having the above-mentioned structure, electrons and holes are injected from a cathode and an anode, respectively, to an organic light-emitting layer. In the organic light-emitting layer, the electrons and the holes are recombined so that organic molecules are put into an excited state. A light-emitting excitation is converted into light specific to the molecules. Efficient light emission of the organic EL element requires improvement of an injection efficiency and a charge balance of the holes and the electrons. For this purpose, in a related art, the hole-injection layer, the electron-injection layer, and a buffer layer are arranged between the electrodes and the light-emitting layer.

Next, description will be made about SWNTs material and doping therefor.

SWNTs have a cylindrical graphite structure having a diameter of several nanometers and a length between several hundred nanometers and several micrometers. Depending on the chirality and the diameter of the SWNTs, there are metallic SWNTs and semiconductor SWNTs. The semiconductor SWNTs can be used for a channel of a transistor. As compared to silicon, the semiconductor SWNTs have a ten times or more drift mobility and a band gap can be structurally controlled by its diameter and chirality. For the above-mentioned reasons, the semiconductor SWNTs are would be considered as particularly important in device application as a post-silicon semiconductor material.

In general, doping means addition of a foreign substance in order to mainly control the property of a semiconductor and particularly to control a conduction type of the semiconductor. There are two conduction types of the semiconductor, i.e., n-type conduction and p-type conduction. A semiconductor exhibiting the n-type conduction is called an n-type semiconductor and electrons contribute to electric conduction. The electrons are supplied from a donor (an electron donor, an n-type dopant) as the foreign substance to a conduction band of the semiconductor. A semiconductor exhibiting the p-type conduction is called a p-type semiconductor and holes contribute to electric conduction. The holes are generated as a result of electrons being taken from a valence band of the semiconductor and captured by an acceptor (an electron acceptor, a p-type dopant) as the foreign substance.

As for the SWNTs, by doping suitable donors or acceptors, n-type conduction SWNTs or p-type conduction SWNTs are produced.

For example, as a related art of producing the n-type conduction SWNTs, the following methods have been reported. Non-patent Document 2 (Physical Review B, Vol. 61, pp. R10606-10608, 2000) discloses a method of vapor-depositing potassium (K) and Non-patent Document 3 (Physical Review Letters, Vol. 87, pp. 256805-256808, 2001) discloses a heat treatment in a vacuum. However, SWNTs channels formed by both of the above-mentioned methods are not suitable for fabrication of a device that is stably operable. This is because the SWNTs channel is chemically unstable in the atmosphere since the donor exists outside SWNTs walls.

As other related arts of producing the n-type conduction SWNTs, there are proposed the following methods. Non-patent Document 4 (Journal of American Chemical Society, Vol. 123, pp. 11512-11513, 2001) discloses a method of supplying polymer containing an imine group from outside the SWNTs. In addition, Patent Document 2 (JP-A-2004-311733 (p. 9, FIGS. 1 and 3)) discloses a method of introducing organic molecules to be a donor into a SWNTs cavity. The n-type conduction SWNTs produced by those methods are stable in the atmosphere but are low in conduction controllability, such as a carrier density, because of use of an organic material. This is because the organic material has a higher ionization potential as compared to alkali metal and the like and therefore a charge amount induced within the SWNTs is relatively small.

Furthermore, as a related art of producing the p-type conduction SWNTs, a method has been reported in which, without performing any special treatment to the SWNTs, oxygen molecules and water molecules that would be considered as a hole supply source are spontaneously adsorbed from the atmosphere. However, with this method, characteristics of a SWNTs transistor are changed depending on an external environment. Therefore, it is not possible to manufacture a reliable device.

Moreover, as another related art of producing the p-type conduction SWNTs, Patent Document 2 has proposed a method of introducing or encapsulating organic molecules acting as acceptors into the SWNTs cavity. The p-type conduction SWNTs produced by this encapsulation are stable in the atmosphere. However, because an encapsulated organic material has a low electron affinity (approximately 3 eV at most) in comparison with an electron affinity of an inorganic material, for example, an electron affinity (approximately 8.4 eV) of tantalum fluoride, the conduction controllability, such as a carrier density, is low.

Furthermore, Patent Document 3 (JP-A-2006-190815 (pp. 4 to 5)) describes details of a principle that the work function of the SWNTs is controlled based on charge transfer caused when donors or acceptors are arranged on a surface of the SWNTs, and the SWNTs encapsulating the donors or the acceptors functions as an electrode controlled in work function. Herein, the principle described in Patent Document 3 will briefly be described. Bands, such as a valence band and a conduction band, in the vicinities of the surfaces of the SWNTs are bent by the charge transfer from the donors or to the acceptors so as to raise or lower a position of a Fermi energy level in the vicinities of the surfaces of the SWNTs. In other words, this shows that a value of the work function of the SWNTs is relatively changed. When a donor having an ionization potential ($I_P$) lower than the work function of the SWNTs is arranged, the band of the SWNTs is bent in an energy depth direction, namely, downward. With this bending, the Fermi energy level of the SWNTs is relatively raised and the work function of the SWNTs is decreased. On the other hand, when an acceptor having an electron affinity ($E_A$) greater than the work function of the SWNTs is arranged, the band of the SWNTs is bent upward. With this bending, the Fermi energy level of the SWNTs is relatively lowered and the work function is increased. As the $I_P$ of the donor arranged is smaller or as the $E_A$ of the acceptor is greater, work function shift of the SWNTs becomes greater. Further, as a surface density of the donors or the acceptors is greater, the work function of the SWNTs is greatly changed. Therefore, by controlling a kind and a concentration of the donors or the acceptors, SWNTs having a desired work function value can be obtained.

Next, description will be made as regards an operation of a work function controlled SWNTs electrode for the purpose of achieving improvement of luminance efficiency and low power consumption of an EL element.

An EL element according to a related art has a structure in which a light-emitting layer is sandwiched between ITO having a high work function (work function: W=4.7 to 5.2 eV) and serving as a positive electrode or anode, and alkali metal or alkaline earth metal having a low work function and serving as a negative electrode or cathode, for example, calcium: Ca (W=2.9 eV). An electronic structure of the EL element is shown in schematic diagrams of FIG. 10. In FIG. 10, (A-1) to (A-3) show changes in energy level when a bias voltage: $V_{bias}$ is gradually applied. (A-1) shows a zero-bias state ($V_{bias}$=0V) where Fermi energy levels of the both electrodes are coincident with each other. (A-2) shows a flat band state where a bias voltage is applied by a work function difference: $\Delta W$ between the both electrodes (in this case, $V_{bias}$=$\Delta W$=1.8 eV). (A-3) shows a state where an electric voltage is further applied and holes and electrons are recombined with each other at the light-emitting layer by current injection to emit light (in this case, $V_{bias}$>$\Delta W$=1.8 eV). If there is no injection barrier at interfaces between the light-emitting layer and the electrodes (anode side: $\phi_{Bp}$, cathode side: $\phi_{Bn}$), light emission starts from the flat band state in (A-2). Actually, however, light emission does not start unless $V_{bias}$ significantly exceeds $\Delta W$ because of presence of $\phi_{Bp}$ and $\phi_{Bn}$ having finite heights. In general, because $\phi_{Bp}$ and $\phi_{Bn}$ are different in magnitude, hole injection and electron injection do not balance with each other. This results in flowing of useless current which does not contribute to light emission without occurrence of recombination.

DISCLOSURE OF THE INVENTION

Problem to be Solved by the Invention

However, a related organic EL element has several problems as follows.

To begin with, a first problem is that the organic EL element has high power consumption in the related art. This is not only against the recent tide of energy saving requirements but also brings about limited applications and a shortened life time of the EL element. The high power consumption is attributed to a low current injection efficiency at the interfaces between the electrodes for injecting an electric current and the light-emitting layer. This is because Fermi energy levels (work functions) of the electrodes are not necessarily coincident with an energy level of a material constructing the light-emitting layer. This incoincidence between the energy levels causes occurrence of injection barriers at the interfaces between the electrodes and the light-emitting layer. As a result, the injection efficiency is limited.

Next, a second problem is that the element is easily degraded and has a short life. This is attributed to chemical instability of an electrode material, in particular, a cathode material for electron injection, which is used in the related art. As mentioned above, alkali metal or alkaline earth metal, which is chemically active, is generally used for the cathode. For example, if an electrode formed of either of the above-mentioned materials is exposed to the atmosphere, its interfacial surface instantaneously reacts with water and oxygen in the atmosphere to bring about oxidization or hydroxylation of the cathode material, interfacial separation between the cathode and the light-emitting layer, and so on. This causes generation of a non-luminous point called a dark spot. In order to prevent the generation of the non-luminous point, development is made of various techniques, such as sealing of the element using a metallic sealing can, sealing by bonding a glass, and a sealing film formed by laminating a barrier thin film having high airtightness. However, with the above-mentioned techniques, an element structure becomes complicated. As a result, reduction in weight and improvement in flexibility become difficult and extra cost is required.

Further, alkali metal or alkaline earth metal constructing the cathode chemically reacts also with a light-emitting layer material. Therefore, the light-emitting layer is degraded and an element life is shortened.

Furthermore, if the element is driven for a long time, alkali metal or alkaline earth metal invade the light-emitting layer due to electromigration. This causes not only degradation of the light-emitting layer but also short-circuiting between the cathode and the anode. As a result, the element becomes nonfunctional. The above-mentioned problems are attributed to the fact that an active cathode material is in an exposed state, and prevent an increase in life time of the organic EL element.

Furthermore, a third problem is that an atmospheric room-temperature process of a low manufacturing cost can not entirely be used in a related EL manufacturing technology. One of reasons is attributed to the fact that a vacuum process, such as vacuum deposition, is required in manufacture of the related cathode using alkali metal or alkaline earth metal. This is because alkali metal or alkaline earth metal is chemically active and is therefore difficult to handle in the atmosphere. Another reason is attributed to the fact that a vacuum process, such as annealing after film formation and subsequent ozone oxidation, is required in manufacturing of ITO which is the related anode. This is because ITO has a high sheet resistance when it is just formed into a film and is required to be improved in film quality and reduced in resistance by annealing, and also because it is necessary to activate an interfacial surface by ozone oxidation to increase a work function. Specifically, even if the atmospheric room-temperature process can partly be used in manufacturing of the light-emitting layer, and so on, the atmospheric room-temperature process can not be used in the whole process of EL manufacture including electrode manufacture. Therefore, at present, the above-mentioned process is hardly associated with reduction in manufacturing cost.

It is therefore a technical object of the present invention to provide a semiconductor device in which reduction in light-emission starting voltage, improvement in luminous efficiency, and low power consumption are achieved.

It is another object of the present invention to provide a semiconductor device in which improvement in reliability, in particular, an increase in life of an element is achieved.

It is still another object of the present invention to provide a semiconductor device which can be manufactured by an atmospheric room-temperature process to thereby achieve improvement in productivity and reduction in manufacturing cost.

Means to Solve the Problem

According to a first aspect of the present invention, there is provided a semiconductor device having a structure in which a light-emitting layer is sandwiched by a cathode and an anode. In the semiconductor device, at least one of the cathode and the anode includes single-wall carbon nanotubes, SWNTs. Each of the single-wall carbon nanotubes encapsulates a donor or an acceptor. The light-emitting layer performs electroluminescence.

According to a second aspect of the present invention, there is provided an organic EL element which includes the semiconductor device described above.

According to a third aspect of the present invention, there is provided a method of manufacturing a semiconductor device. In the aspect of the present invention, the method comprises:

encapsulating at least one of a donor and an acceptor in each of single-wall carbon nanotubes by using ion implantation or a combination of at least one of coating and vapor deposition with heat treatment;

applying or printing, in the atmosphere at room temperature, the single-wall carbon nanotubes in each of which the donor is encapsulated;

forming a light-emitting layer; and applying or printing the single-wall carbon nanotubes in each of which the acceptor is encapsulated.

EFFECT OF THE INVENTION

In the semiconductor device according to the present invention, it is possible to contribute to low power consumption of the EL element because a limiting factor in injection at an electrode interface of the element is reduced or suppressed by using SWNTs electrode whose work function is controlled by encapsulation. Further, in the semiconductor device of the present invention, it is possible to contribute to simplification in structure of the EL element and to small size and light weight of an array and a display device constructed by the EL elements because an electrode and an injection layer are integrated in an encapsulating SWNTs electrode. Therefore, with the semiconductor device and the method of manufacturing the same according to the present invention, characteristics and performance of the EL element can be improved.

Further, with the semiconductor device and the method of manufacturing the same according to the present invention, use of the encapsulating SWNTs electrode eliminates an injection barrier at the interface between the electrode and the light-emitting layer and prevents reaction and migration between the electrode and the light-emitting layer. Therefore, it is possible to prevent the problem of degradation of the electrode and the light-emitting layer, such as a dark spot specific to the EL element, and to contribute to an increase in life of the element. Thus, improvement in reliability of the EL element can be achieved.

Furthermore, with the semiconductor device and the method of manufacturing the same according to the present invention, the encapsulating SWNTs electrode can be manufactured by an atmospheric room-temperature process. Therefore, a manufacturing process of the EL element is simplified and a manufacturing cost can drastically be reduced. Thus, improvement in productivity of the EL element can be achieved.

BEST MODE FOR EMBODYING THE INVENTION

Now, the present invention will be described more in detail.

First, description will be made about a principle of the present invention that SWNTs which encapsulate a donor and an acceptor functions as an electrode controlled in work function.

Figure 1:
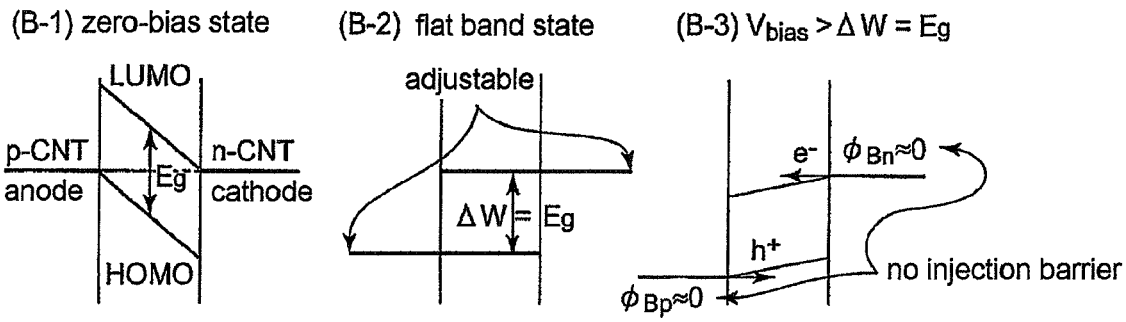
FIG. 1 shows an electronic structure of an EL element of the present invention.
Figure 10:
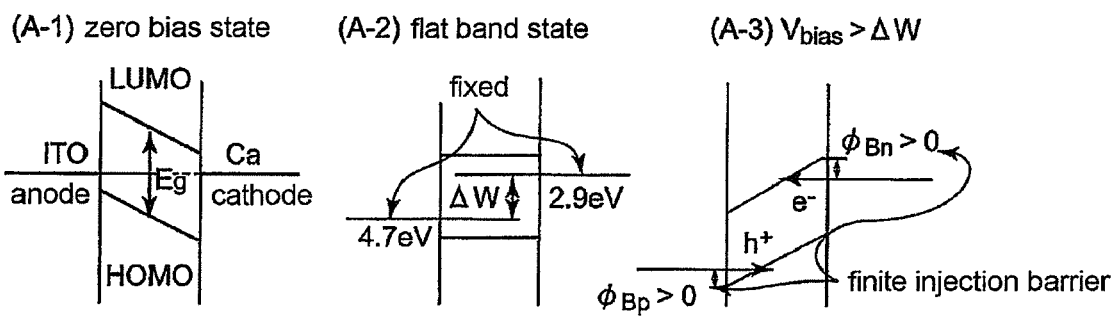
FIG. 10 shows an electronic structure of a related EL element.

FIG. 1 schematically shows an electronic structure of an EL element according to the present invention which includes work function controlled SWNTs electrodes. For comparison, FIG. 10 schematically shows an electronic structure of an EL element using EL electrodes according to a related art. (A-1), (A-2), and (A-3) show a zero-bias state, a flat band state, and a state where a bias voltage is not lower than $\Delta W$, respectively.

Referring to FIG. 1, as shown in (B-1), for an anode, use is made of SWNTs each having a suitable acceptor encapsulated therein so that a their work function is successfully adjusted to a HOMO (highest occupied molecular orbital) energy level of a light-emitting material. For a cathode, use is made of SWNTs each having a suitable donor encapsulated therein so that their work function is successfully adjusted to a LUMO (lowest unoccupied molecular orbital) energy level of the light-emitting material. Thus, the anode and the cathode are formed by p-carbon nanotube (p-CNT) and n-carbon nanotube (n-CNT), respectively, as shown in FIG. 1 (B-1). As shown in (B-3), in case where the work functions are adjusted so that no injection barriers: $\phi_{Bp}$ and $\phi_{Bn}$ are formed at interfaces between the above-mentioned work function controlled encapsulating of the SWNTs electrodes and a light-emitting layer, light emission is started from the flat band state in (B-2). As compared to the case where the EL electrodes according to the related art shown in FIG. 10 (A-1, A-2, and A-3) are used, an operation according to the present invention can be performed with a low electric voltage and a small amount of electric current, that is, with a low power consumption, provided that the amount of light emission is the same. Even in presence of the injection barriers, $\phi_{Bp}$ and $\phi_{Bn}$ can be adjusted to have the same height and, as a result, to balance hole injection and electron injection at the both interfaces. In this manner, it is possible to eliminate useless electric current which does not contribute to light emission without occurrence of recombination. This contributes to reduction in power consumption of the element.

Next, description will be made about a function of the encapsulating SWNTs electrode which brings about improvement in reliability, in particular, an increase in life time of the EL element.

The encapsulating SWNTs include a series of SWNTs composite materials with other materials, such as atoms, molecules, and ions thereof, introduced into cavities of the SWNTs. The encapsulating SWNTs have the following characteristics. First, under the influence of encapsulated materials, the encapsulating SWNTs express a property different from that of simple SWNTs. Secondly, the encapsulated materials are spatially isolated from external environment and are stabilized. The first characteristic is attributed to the facts that graphite constituting the SWNTs originally has an amphoteric nature allowing easy interaction with both of a cathode material and an anode material and that an interaction, such as charge transfer and hybridization of electronic states, is easily caused due to an effect of proximity arrangement of the encapsulated materials by microscopic cavity structures of the SWNTs. The second characteristic is attributed to the fact that graphite external walls of the SWNTs are extremely stable chemically, thermodynamically, and mechanically.

In the present invention, the above-mentioned characteristics of the encapsulating SWNTs are positively utilized. As already mentioned, by using the first characteristic, work function control of the SWNTs is achieved. Stabilization of the encapsulated materials as the second characteristic can be used for the increase in life of the EL element. Specifically, the electrode formed of the encapsulating SWNTs does not cause the problem of degradation of the EL element. This is because the encapsulating SWNTs are chemically inactive and stable. The encapsulating SWNTs electrode does not react with water and oxygen in the atmosphere, does not react with the light-emitting layer material, and causes no electromigration. Therefore, the encapsulating SWNTs electrode is prevented from occurrence of dark spots, degradation of the light-emitting layer material, and short-circuiting of the element which have been the problems in the cathode in the related art. As a result, the encapsulating SWNTs electrode drastically improves reliability of the EL element and greatly contributes to an increase in life of the EL element.

Finally, description will be made about a function of the encapsulating SWNTs electrode, which provides improvement in productivity of the EL element.

As mentioned above, the encapsulating SWNTs are inactive and stable. Therefore, the encapsulating SWNTs electrode can be dispersed in a suitable solvent to become an ink-like solution. This means that, in manufacturing of an electrode of the EL element, a coating process can be used. In manufacturing of a related electrode, a vacuum process is required. However, if the encapsulating SWNTs electrode is used, it is possible to adopt an atmospheric room-temperature process low in manufacturing cost in the whole process of EL manufacturing. This leads to reduction in element manufacturing cost and means that the productivity can drastically be improved.

FIG. 2(A) schematically shows a basic structure of an EL element according to a first embodiment of the present invention. In FIG. 2(A), a reference number "1" represents a molecule structure of a donor-encapsulating SWNTs electrode while a reference number "6" represents a molecule structure of an acceptor-encapsulating SWNTs electrode and a reference number "7" represents an external power source.

Referring to 2(A), the acceptor-encapsulating SWNTs layer (or a SWNTs anode) 4 composed of the molecule structure 6 is formed on a substrate 5. A light-emitting layer 3 is formed on the SWNTs anode 4. Furthermore, the donor-encapsulating SWNTs layer (or a SWNTs cathode) 2 composed of the molecular structure 1 is formed on the light-emitting layer 3. Such a SWNTs electrode 2 or 4 has a thickness of 10 nm to 10 μm. For ensuring transparency, the thickness is preferably as small as possible. However, a sheet resistance becomes high if the thickness is too small. In general, the thickness is adjusted so that a transmittance is not less than 80% in a visible range and a sheet resistance is not more than 1 kΩ/sq. Preferably, the transmittance is not less than 80% and the sheet resistance is not more than 200 Ω/sq. The SWNTs anode 4 and the SWNTs cathode 2 are homogeneous in optical property and are therefore replaceable with each other in position. When transparency is ensured for the SWNTs anode 4 and the SWNTs cathode 2, it is possible to provide any type, such as a bottom emission type in which light is extracted downward from the substrate 5, a top emission type in which light is extracted upward, and a double-sided display type. Further, in a case of the bottom emission type, the substrate 5 is a transparent glass or a plastic substrate. In a case of the top emission type, a kind of the substrate is not limited. The light-emitting layer 3 may be either of a low molecular material and a polymer material. If the atmospheric room-temperature process is used, the polymer material allowing the use of the coating process is desirable.

Figure 2:
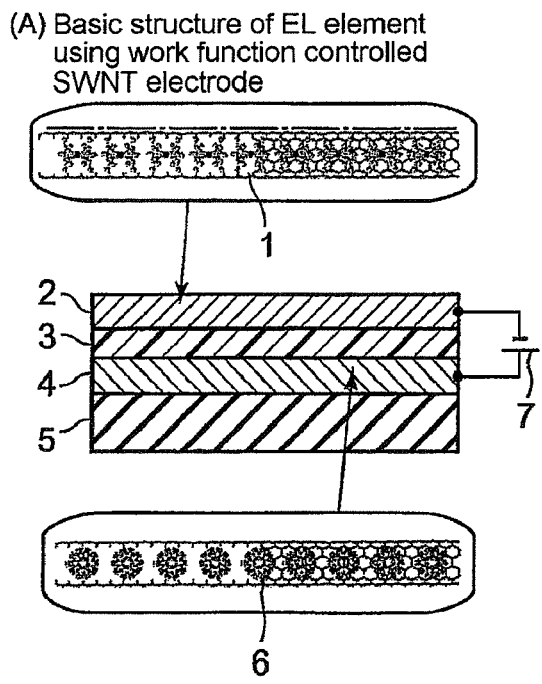
FIG. 2 shows, in (A) to (C), a section of a basic structure of the EL element of the present invention and an electronic structure during driving.
Figure 2:
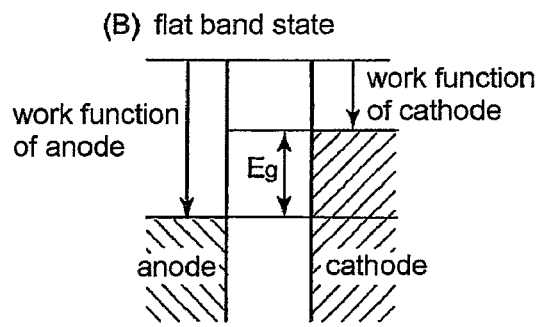
Figure 2:
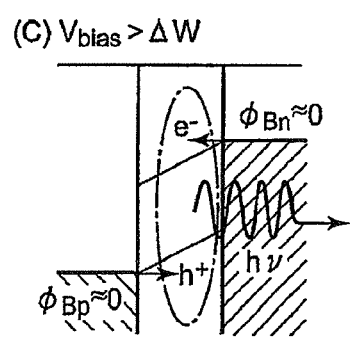

In FIG. 2, (B) shows an electronic structure of the EL element. A work function of the SWNTs cathode and a work function of the SWNTs anode are adjusted so as to be coincident with the LUMO energy of the light-emitting layer material and the HOMO energy of the light-emitting layer material, respectively. Then, a HOMO-LUMO gap ($E_g$) of the light-emitting layer material is equal to a work function difference between the SWNTs anode and the SWNTs cathode. No injection barrier is present at an interface between the electrode and the light-emitting layer. Accordingly, when a bias voltage corresponding to the HOMO-LUMO gap is applied in the state of (A), a flat band state in (B) is obtained and light emission is started. A luminous efficiency is high because there is no injection barrier as shown in (C).

Figure 3:
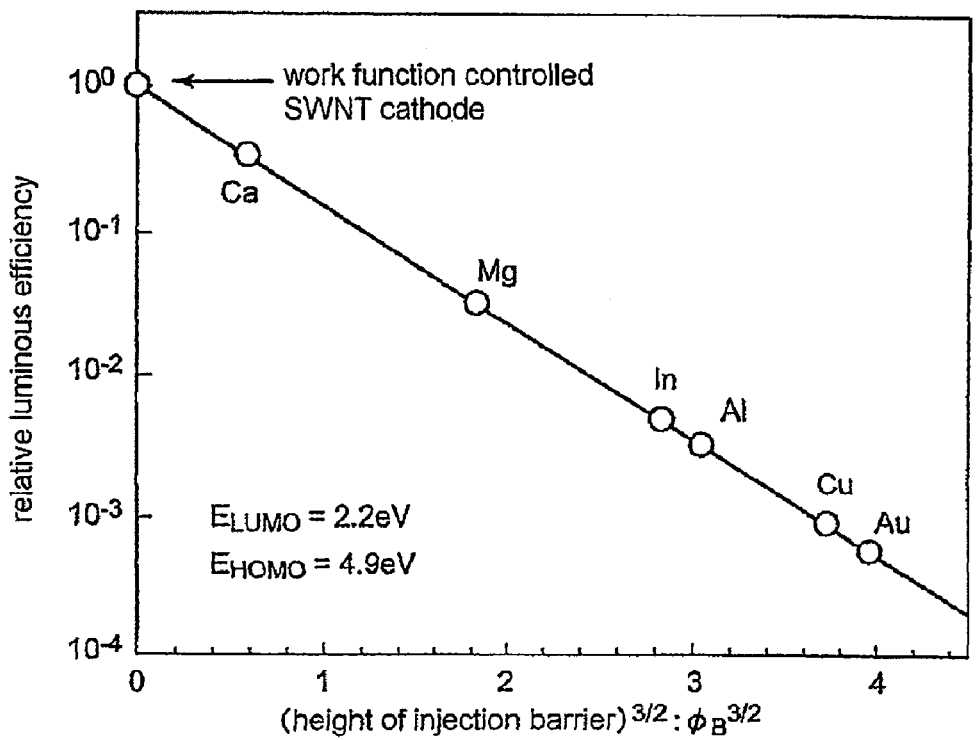
FIG. 3 is a view for comparing luminous efficiencies of the present invention and a related electrode.

FIG. 3 is a view for comparing luminous efficiencies in cases of using the work function controlled SWNTs electrodes each having a zero injection barrier and the EL electrode of the related art. Referring to FIG. 3, a horizontal axis shows 1.5 th power of a magnitude of the injection barrier and a vertical logarithmic axis shows a relative luminous efficiency. Comparison is made under a condition that an anode of ITO is fixedly used and a kind of a cathode is variously changed. A LUMO energy and a HOMO energy of the light-emitting layer material are 2.2 eV and 4.9 eV, respectively. A point indicated by an arrow shows a case of the SWNTs cathode. It is seen that, as compared to the related art cathodes, a luminous efficiency of the SWNTs cathode is about 3 times higher than that in the case of calcium, about 30 times higher than that in the case of magnesium, and about 300 times higher than that in the case of aluminum. Also in comparison of a work function controlled SWNTs anode with ITO as a related art anode, from the same discussion, superiority of the work function controlled SWNTs anode is shown. The above-mentioned results prove that the work function controlled SWNTs electrode is extremely superior to the related art electrodes and significantly contributes to improvement in performance of the EL element, especially to reduction in driving voltage and decrease in power consumption.

Figure 4:
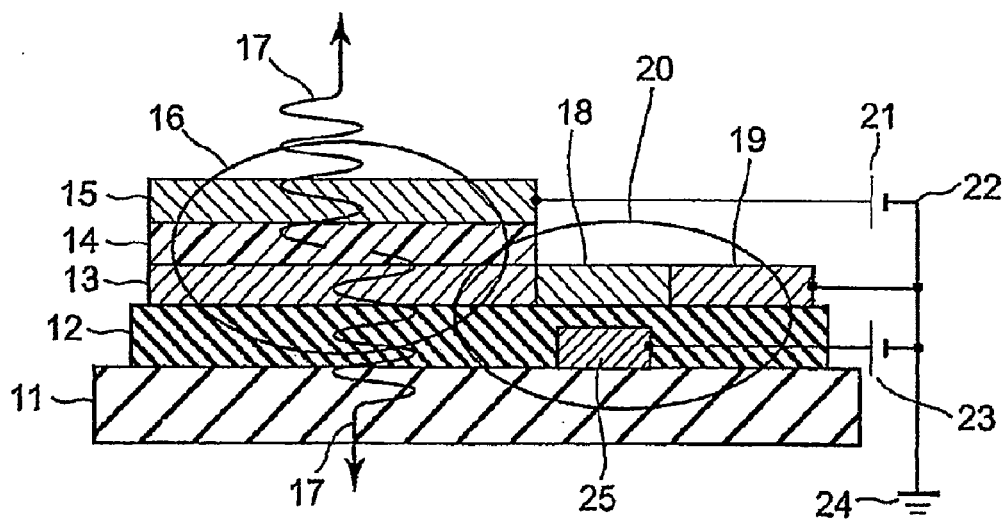
FIG. 4 is a sectional view of a basic structure of an EL element with a driving TFT according to the present invention.

FIG. 4 is a sectional view showing a basic structure of an EL element portion 16 with a driving switching thin film transistor (TFT) 20. Referring to FIG. 4, the EL element portion 16 is basically the same structure as that shown in FIG. 2. Namely, the illustrated EL element portion 16 is formed on an insulating layer 12 deposited on a substrate 11. Specifically, the EL element portion 16 comprises a donor-encapsulating SWNTs cathode layer (or a SWNTs cathode) 13 on the insulating layer 12, a light-emitting layer 14 on the SWNTs cathode 13, and an acceptor-encapsulating SWNTs anode layer (or a SWNTs anode) 15 on the light-emitting layer 14.

The driving TFT portion 20 includes a gate electrode 25 formed on the substrate 11 and covered with the insulating layer 12, a thin film channel region 18 on the insulating layer 12, and source and drain electrodes 19 either one of which is common to the SWNTs cathode 13. From this fact, it is readily understood that not only the source and the drain electrodes 19 and 13 are structured by SWNTs but also the gate electrode 25 and the thin film channel region 18 are structured by SWNTs. This structure makes it possible to simplify the EL element portion 16 and the driving TFT portion 20. Thus, the illustrated driving TFT has the source and the drain electrode, the gate electrode 25, and the thin film channel region 18 all of which are constituted by SWNTs.

The illustrated EL element portion 16 and the driving TFT portion 19 are electrically connected by a wiring 22 in the illustrated manner. More specifically, a first power source 21 is connected between the SWNTs anode 15 of the EL element portion 16 and the source or drain electrode 19 of the TFT portion 20 while a second power source 23 is connected between the gate electrode 25 of the driving TFT 20 and ground 24. Metallic SWNTs are also usable as the source electrode 20, the drain electrode 13, and the gate electrode 25. In this event, like the SWNTs electrode 13, 15 for EL, it is preferable that the source electrode and the drain electrode of the driving TFT portion 20 are metalized by encapsulation of a donor or an acceptor. This is because, if the thin film channel 18 and the EL-TFT common SWNTs electrode are reversed to each other in polarity, an npn or a pnp structure is formed. This structure makes it possible to reduce off-current of the driving TFT portion 20 and to thereby lower power consumption. Incidentally, an insulating layer 12 is provided in order to electrically insulate the gate electrode 25 from the thin film channel 18 and, therefore, may not be extended to a position directly below the EL element portion 16. Although a kind of the substrate 11 is not limited, flexibility is achieved if a plastic substrate is used. Further, if a transparent substrate is used, a bottom emission type of the EL element portion 16 can be achieved. With the structure mentioned above, an electric current flowing into the EL element portion 16 can be controlled by a gate voltage.

Next, description will be made as regards a method of manufacturing the semiconductor device according to the first embodiment.

First, a work function controlled SWNTs electrode material is manufactured by encapsulation of the SWNTs. By encapsulating donors into the SWNTs, the cathode is manufactured. By encapsulating acceptors into the SWNTs, the anode is manufactured. The donors and the acceptors to be encapsulated have the following property conditions. Such a donor is required to have an ionization potential ($I_P$) lower than an effective intrinsic work function of the SWNTs. As derived from an experimental result shown in (first example) described later, the donor desirably has $I_P$ of not more than 6.4 eV. Further, such an acceptor is required to have an electron affinity ($E_A$) higher than the effective intrinsic work function of the SWNTs. As derived from an experimental result shown in (second example) described later, the acceptor desirably has $E_A$ of not less than 2.3 eV.

As a first method of SWNTs encapsulation, first, a material to be encapsulated is subjected to ion implantation into the SWNTs. If necessary, a thermal annealing treatment is subsequently carried out. Ion implantation is suitable for encapsulation of atomic ions. As the donor, use is made of an alkali metal element, such as Li ($I_P$=5.39 eV), Na ($I_P$=5.14 eV), K ($I_P$=4.34 eV), Rb ($I_P$=4.18 eV), and Cs ($I_P$=3.89 eV), an alkaline earth metal element, such as Ca ($I_P$=6.11 eV), Sr ($I_P$=5.70 eV), and Ba ($I_P$=5.21 eV), a typical metal element, such as In ($I_P$=5.79 eV), Al ($I_P$=5.99 eV), and Ga ($I_P$=6.00 eV), and a lanthanoid metal element, such as Y ($I_P$=6.38 eV), La ($I_P$=5.58 eV), Ce ($I_P$=5.47 eV), Pr ($I_P$=5.42 eV), Nd ($I_P$=5.49 eV), Sm ($I_P$=5.63 eV), Eu ($I_P$=5.67 eV), Gd ($I_P$=6.14 eV), Tb ($I_P$=5.85 eV), Dy ($I_P$=5.93 eV), Ho ($I_P$=6.02 eV), Er ($I_P$=6.10 eV), Tm ($I_P$=6.18 eV), Yb ($I_P$=6.25 eV), and Lu ($I_P$=5.43 eV), or the like. As the acceptor, use is made of a halogen element, such as fluorine ($E_A$=3.40 eV), chlorine ($E_A$=3.61 eV), bromine ($E_A$=3.36 eV), and iodine ($E_A$=3.06 eV), or the like. When atoms are encapsulated into the SWNTs, the maximum surface density is higher as compared to that of molecules. Therefore, encapsulating atoms brings about a feature that the work function of the SWNTs is controlled over a wide range. Especially, the alkali metal element and the alkaline earth metal element having low $I_P$ are effective in reduction in work function of the SWNTs while the halogen element having high $E_A$ is effective in increase in work function of the SWNTs. Ion implantation is carried out as follows. After forming a SWNTs film on a suitable substrate by coating, implantation is performed in a vacuum by using an ion source of an element desired to be encapsulated. Depending on a thickness of the SWNTs film, an ion kinetic energy is adjusted so that the ions reach the deepest part. The ion kinetic energy is within a range between 50 eV and 50 keV. When the ion kinetic energy is approximately 100 eV to 150 eV, injected ions penetrate external walls of the SWNTs, without leaving any damage, to be encapsulated. Therefore, the kinetic energy within the above-mentioned range is desirable. However, in this case, the thickness of the SWNTs film becomes as thin as approximately 10 to 100 nm. Accordingly, for mass-production of the encapsulating SWNTs, it is necessary to prepare a large-area SWNTs film. Further, by adjustment of ion injection dose, the work function of the SWNTs is controlled. Depending on the ion injection dose, the work function of the SWNTs can be controllably changed from an original value (W=4.85 eV). In theory, the work function can be decreased by 2.65 eV at maximum (W=2.2 eV) by donor encapsulation and increased by 1.0 eV at maximum (W=5.85 eV) by acceptor encapsulation. Alternatively, the work function can also be controlled by performing ion injection with an excessive dose and de-doping by thermal annealing. A thermal annealing temperature is in a range between 100 and 500° C.

A second method of SWNTs encapsulation is a method of mixing a material to be encapsulated into SWNTs, coating or evaporating the same and thereafter carrying out thermal annealing. This method is applied to atom encapsulation and is also suitable for encapsulation of molecules which are prone to be destroyed by ion implantation. This method has a feature that a relatively large amount of the encapsulation SWNTs can be obtained. As the donor to be encapsulated, in addition to the elements described in the first method, use may be made of metallocenes, such as chromocene: $(\eta\text{-}C_5H_5)_2$ Cr ($I_P$=5.40 eV), manganocene: $(\eta\text{-}C_5H_5)_2$Mn ($I_P$=6.12 eV), cobaltocene: $(\eta\text{-}C_5H_5)_2$Co ($I_P$=5.2 eV), nickelocene: $(\eta\text{-}C_5H_5)_2$Ni ($I_P$=6.2 eV), dimethylchromocene: $[\eta\text{-}C_5H_3(CH_3)_2]_2$Cr ($I_P$=5.1 eV), dimethylmanganocene: $[\eta\text{-}C_5H_3(CH_3)_2]_2$Mn ($I_P$=5.8 eV), dimethylcobaltocene: $[\eta\text{-}C_5H_3(CH_3)_2]_2$Co ($I_P$=5.0 eV), dimethylnickelocene: $[\eta\text{-}C_5H_3(CH_3)_2]_2$Ni ($I_P$=5.9 eV), decamethylchromocene: $[\eta\text{-}C_5(CH_3)_5]_2$Cr ($I_P$=4.0 eV), decamethylmanganocene: $[\eta\text{-}C_5(CH_3)_5]_2$Mn ($I_P$=4.7 eV), decamethylferrocene: $[\eta\text{-}C_5(CH_3)_5]_2$Fe ($I_P$=5.4 eV), decamethylcobaltocene: $[\eta\text{-}C_5(CH_3)_5]_2$Co ($I_P$=3.4 eV), and decamethylnickelocene: $[\eta\text{-}C_5(CH_3)_5]_2$Ni ($I_P$=4.4 eV). Also, use may be made of, as the encapsulated donor, a donor organic compound, such as tetrakis(dimethylamino)ethylene: TDAE ($I_P$=5.36 eV), N,N,N',N'-tetramethyl-para-phenylenediamine: TMPD ($I_P$=6.20 eV), tetramethyltetraselenafulvalene: TMTSF ($I_P$=6.27 eV), and tetrathiafulvalene: TTF ($I_P$=6.40 eV). On the other hand, as the acceptor to be encapsulated, in addition to the elements described in the first method, use may be made of fullerenes, such as $C_{60}$ ($E_A$=2.60 eV), $C_{70}$ ($E_A$=2.68 eV), $C_{74}$ ($E_A$=3.30 eV), $C_{76}$ ($E_A$=2.90 eV), $C_{78}$ ($E_A$=3.12 eV), $C_{80}$ ($E_A$=3.19 eV), and $C_{82}$ ($E_A$=3.14 eV), fullerene fluorides, such as $C_{60}F$ ($E_A$=2.78 eV), $C_{60}F_2$ ($E_A$=2.74 eV), $C_{60}F_{36}$ ($E_A$=3.48 eV), $C_{60}F_{48}$ ($E_A$=4.06 eV), $C_{70}F_2$ ($E_A$=2.80 eV), and $C_{70}F_{52}$ ($E_A$=4.06 eV), and metal-encapsulating fullerenes, such as Ca@$C_{60}$ ($E_A$=3.0 eV), La@$C_{74}$ ($E_A$=2.9 eV), Gd@$C_{60}$ ($E_A$=3.0 eV), Gd@$C_{74}$ ($E_A$=3.24 eV), Gd@$C_{76}$ ($E_A$=3.1 eV), Gd@$C_{78}$ ($E_A$=3.26 eV), Gd@$C_{80}$ ($E_A$=3.3 eV), and Gd@$C_{82}$ ($E_A$=3.3 eV). Further, superhalogen represented by a composition formula $MX_{k+1}$ (M is a typical or a transition metal atom, X is a halogen atom, and k is the maximum formal valence of the M atom) has an electron affinity higher than that of a constituent halogen element. Therefore, superhalogen is usable as the encapsulated acceptor. Such superhalogen may be $TaF_6$ ($E_A$=8.4 eV), $Ta_2F_{11}$ ($E_A$=11.84 eV), $Ta_3F_{16}$ ($E_A$=12.63 eV), $AlF_4$ ($E_A$=7.96 eV), $HfF_6$ ($E_A$=8.8 eV), $WF_6$ ($E_A$=3.5 eV), $ReF_6$ ($E_A$=4.8 eV), $OsF_6$ ($E_A$=6.0 eV), $IrF_6$ ($E_A$=7.2 eV), $PtF_6$ ($E_A$=7.4 eV), $AuF_6$ ($E_A$=8.1 eV), $HgF_6$ ($E_A$=5.8 eV), $AsF_6$ ($E_A$=7.95 eV), $SbF_6$ ($E_A$=6.0 eV), $TeF_7$ ($E_A$=11.9 eV), $WF_7$ ($E_A$=6.505 eV), $MnF_8$ ($E_A$=6.7 eV), $Al_2F_7$ ($E_A$=11.16 eV), $P_2F_{11}$ ($E_A$=10.95 eV), $V_2F_{11}$ ($E_A$=10.98 eV), $As_5F_{16}$ ($E_A$=12.20 eV), $Al_2Cl_7$ ($E_A$=7.75 eV), $PBr_6$ ($E_A$=6.66 eV), $Al_2Br_7$ ($E_A$=7.08 eV), or the like. Furthermore, as the encapsulated acceptor, use may also be made of an acceptor organic compound, such as tetrafluorocyano-para-quinodimethane: $F_4$TCNQ ($E_A$=3.38 eV), 2,3-dichloro-5,6-dicyano-para-benzoquinone: DDQ ($E_A$=3.13 eV), 7,7,8,8-tetracyanoquinodimethane: TCNQ ($E_A$=2.80 eV), and tetrachloro-para-benzoquinone: para-chloranil ($E_A$=2.76 eV). It is noted here that, as $I_P$ of the encapsulated donor is smaller or as $E_A$ of the encapsulated acceptor is greater, work function controllability of the SWNTs is improved. A material to be encapsulated is applied to the SWNTs as follows. A material desired to be encapsulated is dissolved in a suitable solvent and a resultant solution is dispersed on a SWNTs film. Alternatively, the SWNTs are suspended in a solution of the material desired to be encapsulated and a resultant suspension is dispersed on a suitable substrate. Vapor deposition is performed by using ordinary molecular beam deposition. Subsequently, thermal annealing is carried out. A thermal annealing temperature is in a range between 100 and 500° C. Finally, a remaining material which has not been encapsulated is sublimed or cleaned with an appropriate solvent. Thus, encapsulating SWNTs are obtained.

An encapsulating SWNTs thin film manufactured by the above-mentioned manufacturing method generally has a high transparency over an entire visible range and a low sheet resistance. Typically, with respect to a visible light having a wavelength of 500 nm, the encapsulating SWNTs thin film has a sheet resistance of approximately 1 kΩ/sq. when a transparency is 95%, approximately 200 Ω/sq. when a transparency is 80%, and approximately 20 Ω/sq. when a transparency is 65%. Consequently, the encapsulating SWNTs thin film fully satisfies a specification (transparency: not less than 80%, sheet resistance: not more than 1 kΩ/sq.) required for a transparent electrode.

Figure 5:
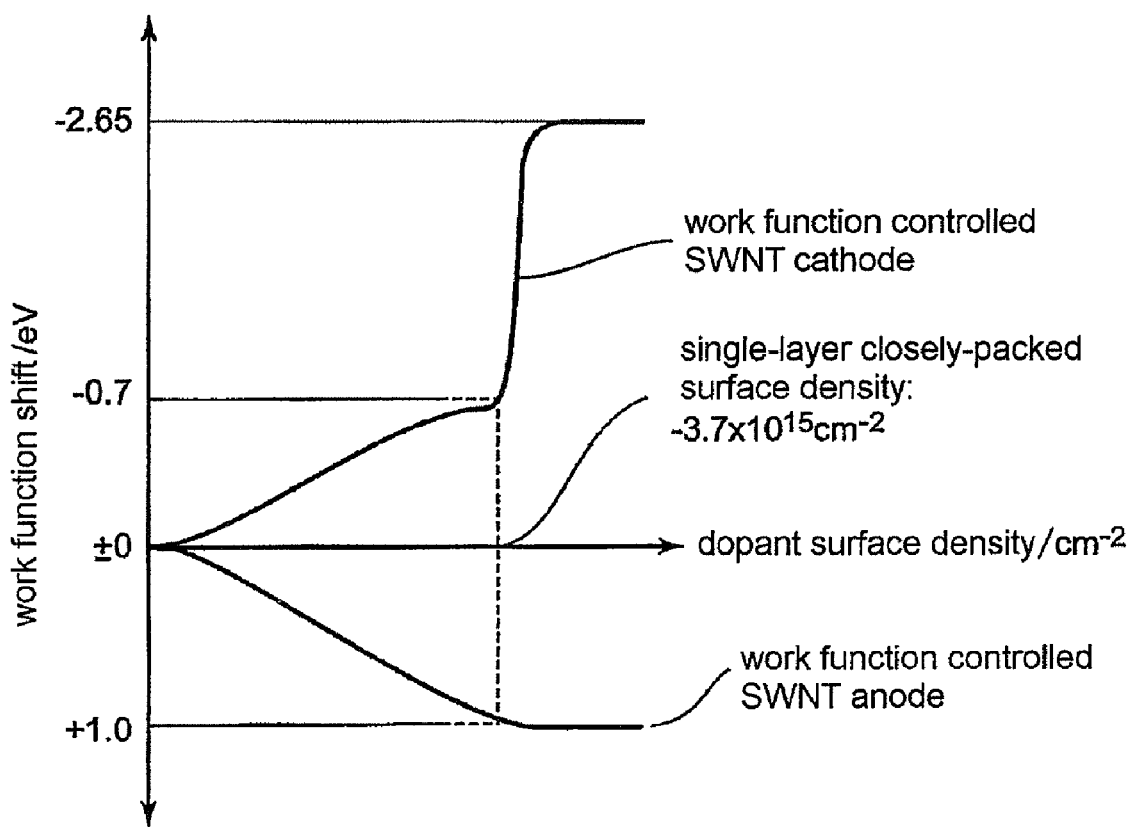
FIG. 5 shows a relationship between work function shift and a surface density of an encapsulated material.

FIG. 5 is a view showing, regarding the encapsulating SWNTs manufactured by the above-mentioned manufacturing method, work function shift accompanying encapsulation as a function of a surface density of each of the encapsulated donor and acceptor. In this case, it is assumed that the encapsulated donor has $I_P$ of 3.89 eV in an isolated state and a work function of 2.2 eV (corresponding to cesium) in a bulk state, and that the encapsulated acceptor has $E_A$ of 4.2 eV (corresponding to polyiodine: $I_3$). The work function shift represents a work function difference between undoped SWNTs (W=4.85 eV and doped SWNTs. Since the work function is reduced by encapsulating a donor, the work function shift has a minus value. On the other hand, since the work function is increased by encapsulating an acceptor, the work function shift has a plus value. A single-layer closely-packed surface density on a horizontal axis means a surface density of carbon atoms constituting a SWNTs graphite layer and corresponds to the maximum surface density at which the donor or the acceptor can be packed in a monomolecular (monoatomic) layer. This value is about $3.7 \times 10^{15}$ cm$^{-2}$. If encapsulation is performed further, a second layer is formed on the first layer toward a center of the SWNTs. Generally, no charge transfer occurs from the second layer to the SWNTs due to the electrostatic shielding by the first layer. Therefore, in a case of encapsulating the acceptor, the work function shift is the maximum at the single-layer closely-packed surface density and this value is approximately plus 1.0 eV. Accordingly, the maximum value of the work function of the acceptor-encapsulating SWNTs is 5.85 eV. On the other hand, in a case of encapsulating the donor, the work function shift in the vicinity of the single-layer closely-packed surface density has a different mechanism. This is because bulk metallization due to an excessive donor is caused. Therefore, when the single-layer closely-packed surface density is exceeded, the work function of the encapsulating SWNTs is drastically reduced and asymptotically approaches to the work function of the donor in the bulk state. In this case, cesium is assumed as the donor. Accordingly, an asymptotic value of the work function shift is minus 2.65 eV and the minimum value of the work function of the donor-encapsulating SWNTs is expected to be 2.2 eV.

Next, description will be made about a method of manufacturing the EL element using a work function controlled SWNTs electrode material.

First, the work function controlled SWNTs material manufactured by the above-mentioned method is dispersed in a suitable solvent to become an ink-like solution. In order to enhance the dispersion, an ultrasonic treatment, addition of a surfactant, and so on may be carried out. A cathode-lead out portion is patterned on a suitable substrate made of glass, plastic, and so on and a donor-encapsulating SWNTs layer is formed thereon. Subsequently, a light-emitting layer is formed on the donor-encapsulating SWNTs layer. Further, an acceptor-encapsulating SWNTs layer is formed on the light-emitting layer. Finally, an anode lead-out portion is formed. In a case of an element with a driving TFT, processes of forming a gate electrode lead-out portion, forming a SWNTs gate electrode and an insulating layer, forming a SWNTs source electrode (or a SWNTs drain electrode), and forming a SWNTs source electrode (or a SWNTs drain electrode) lead-out portion are added to the processes mentioned above. In order to form the SWNTs layer and the light-emitting layer, use may be made of spin coating, gravure printing, ink-jet, or the like. This method is an atmospheric room-temperature process and is therefore advantageous in that a manufacturing process can be simplified and a manufacturing cost is inexpensive. Incidentally, when a low molecular light-emitting material is used, vacuum deposition using a shadow mask can be used in formation of the light-emitting layer. In this case, however, there is a disadvantage that the processes become complicated since a vacuum process is interposed and a manufacturing cost is increased since a material utilization efficiency is poor.

EXAMPLES

Next, examples of the present invention will be described. However, the present invention is not limited to these examples.

First Example

Work function controllability of the SWNTs material shown in the present invention was examined both experimentally and theoretically. First, a SWNTs transistor having SWNTs as a channel was formed by a method described in Patent Document 4 (JP-A-2004-67413). Briefly describing the SWNTs transistor, gold/titanium was used for source and drain electrodes, a silicon oxide film of about 100 nm was used for an insulating layer, and highly-doped n-type silicon/gold was used for a gate electrode. The SWNTs channel was formed by in-situ growth by the catalytic chemical vapor deposition using hydrocarbon, such as methane, as a source material. The SWNTs channel has a diameter of typically 1 to 2 nm and a length of about 300 nm which is defined by a distance between the source electrode and the drain electrode. Next, the SWNTs channel was doped with a donor, such as cesium ($I_P$=3.89 eV), potassium ($I_P$=4.34 eV), or indium ($I_P$=5.79 eV) by ion beam deposition and a drain current-gate voltage characteristic of the SWNTs transistor was measured. From the characteristic, a gate voltage threshold was obtained. By applying the charge transfer doping theory, the threshold was converted into a band bending amount in the vicinity of the surface of the doped SWNTs, and from the band bending, work function shift of the SWNTs was finally calculated.

Figure 6:
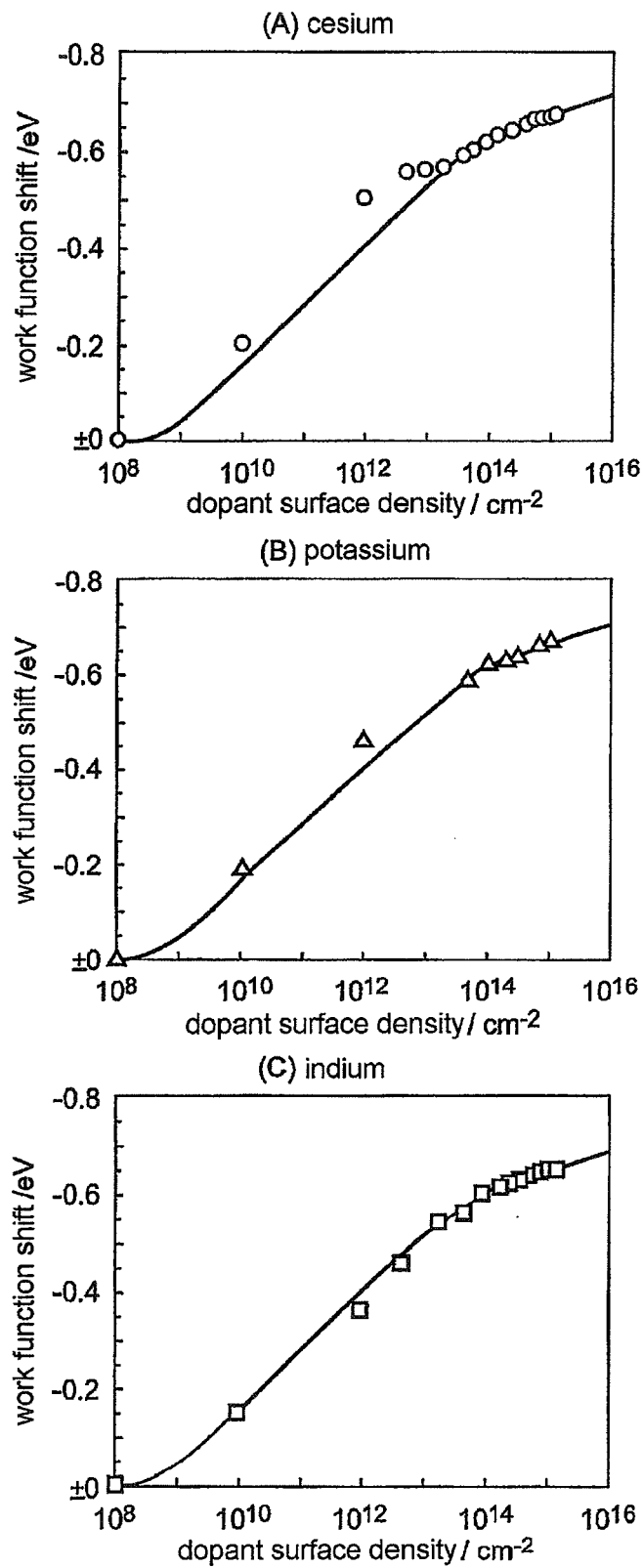
FIG. 6 shows donor surface density dependence of work function shift of donor-doped SWNTs, (A), (B), and (C) showing cases of cesium (Ip=3.89 eV), potassium (Ip=4.34 eV), and indium (Ip=5.79 eV), respectively.

FIG. 6 shows a donor surface density dependence of the work function shift of a donor-doped SWNTs.

(A), (B), and (C) show cases of cesium, potassium, and indium, respectively. Each plot indicates an experimental value and each curve is a fitting curve based on the charge transfer doping theory. It is seen that, among (A) to (C), as the donor surface density is increased, the work function shift is drastically moved in a minus direction so that the work function is decreased. When the donor surface density exceeds $5 \times 10^{13}$ cm$^{-2}$ in the cases of (A) and (B) and when the donor surface density exceeds $1 \times 10^{15}$ cm$^{-2}$ in the case of (C), the work function shifts tend to be saturated. At the donor surface density around $1 \times 10^{15}$ cm$^{-2}$, the work function shift is about minus 0.68 eV in the cases of (A) and (B) and about minus 0.65 eV in the case of (C) by actual measurement. When the donor surface density exceeds $1 \times 10^{15}$ cm$^{-2}$, the SWNTs transistor tends to no longer exhibit gate dependence. Hence, by this method, it is impossible to evaluate the work function shift at the single-layer closely-packed surface density ([[~]] $3.7 \times 10^{15}$ cm$^{-2}$) or more. Evaluation at the single-layer closely-packed surface density or more was performed by atmospheric photoelectron spectroscopy which will be described in a third example.

The donor surface density dependence of the work function shift of the SWNTs, which was obtained by the above-mentioned experiment, is fitted by a theoretical curve. Then, it is possible to obtain an upper limit of $I_P$ to be possessed by a donor capable of being effectively doped into the SWNTs. Specifically, it is concluded that, as a necessary condition required for a donor to perform electron-doping to the SWNTs, the donor must have $I_P$ of not more than 6.4 eV.

Second Example

Figure 7:
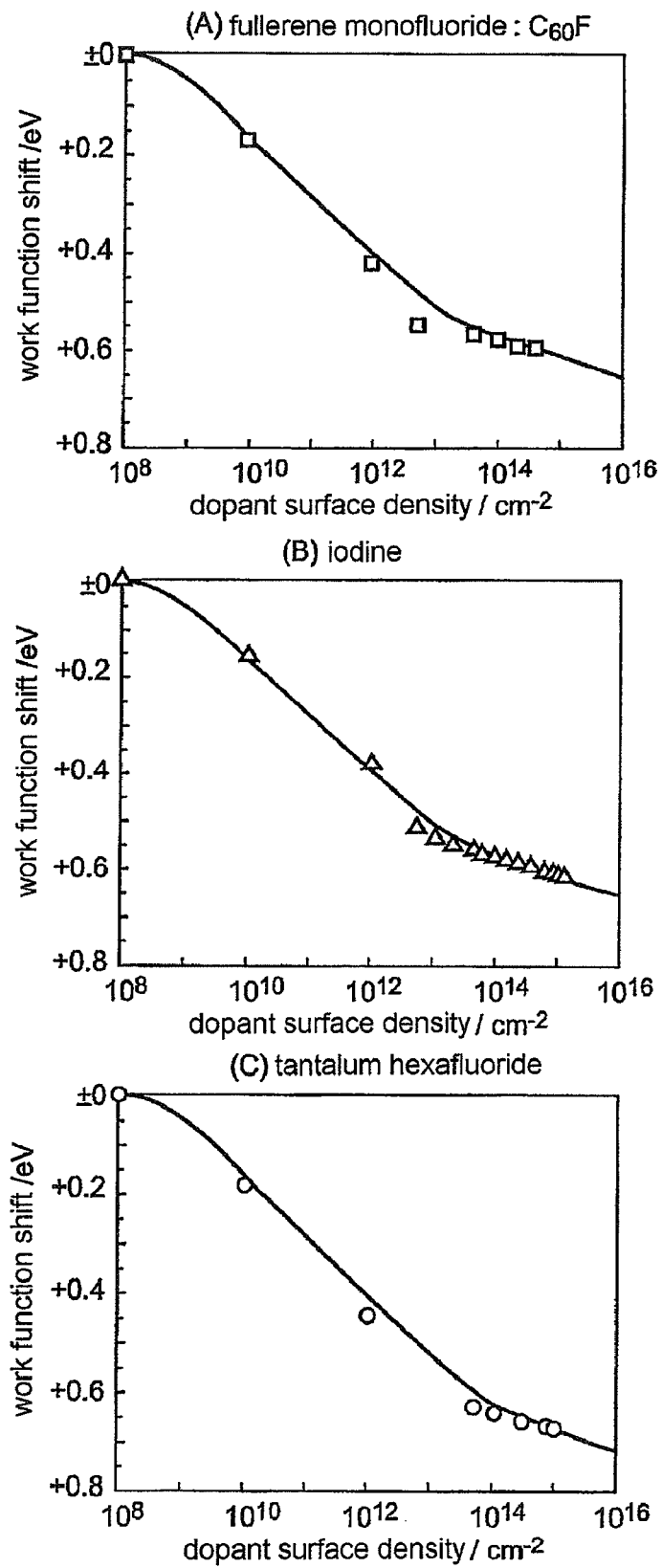
FIG. 7 shows acceptor surface density dependence of work function shift of acceptor-doped SWNTs, (A), (B), and (C) showing cases of fullerene monofluoride: $C_{60}F$ ($E_A$=2.78 eV), iodine ($E_A$=3.08 eV), and tantalum fluoride: $TaF_6$ ($E_A$=8.4 eV), respectively.

By the technique same as the first example, work function controllability of an acceptor doped SWNTs was examined. FIG. 7 shows an acceptor surface density dependence of work function shift of the acceptor doped SWNTs. (A) shows a case of fullerene monofluoride: $C_{60}F$ ($E_A$=2.78 eV), (B) shows a case of iodine ($E_A$=3.08 eV), and (C) shows a case of tantalum fluoride: $TaF_6$ ($E_A$=8.4 eV). Contrary to the donor doped SWNTs, as the acceptor surface density is increased, the work function shift is drastically extended in a plus direction so that the work function of the SWNTs is increased. When the acceptor surface density is around $1 \times 10^{13}$ cm$^{-2}$ in the cases of (A) and (B) and when the acceptor surface density is around $5 \times 10^{13}$ cm$^{-2}$ in the case of (C), the work function shifts tend to be saturated. At the acceptor surface density around $1 \times 10^{15}$ cm$^{-2}$, the work function shift is plus 0.6 eV in the cases of (A) and (B) and plus 0.68 eV in the case of (C) by actual measurement.

The acceptor surface density dependence of the work function shift of the SWNTs, which was obtained by the experiment, is fitted by a theoretical curve. Then, it is possible to provide a lower limit of $E_A$ to be possessed by acceptors capable of being effectively doped into the SWNTs. Specifically, it is concluded that, as a necessary condition required for acceptors to perform hole-doping to the SWNTs, the acceptors must have $E_A$ of not less than 2.3 eV.

Third Example

Donor-encapsulating SWNTs ware manufactured by the above-mentioned manufacturing method. First, a SWNTs produced by laser ablation was dispersed in chloroform to prepare a standard SWNTs suspension. The concentration was 0.1 milligram/liter. A fixed quantity of the suspension was taken out and, if necessary, a fixed quantity of chloroform was added. Then, suction filtration was performed by using a filter paper. Thereafter, the SWNTs adhered to the filter paper was transferred to a suitable substrate, such as a SUS plate, to obtain a SWNTs film. The SWNTs film had a thickness of typically 10 nm to 100 μm depending on a concentration upon filtration.

As an encapsulated donor, first, cesium ($I_P$=3.89 eV) and potassium ($I_P$=4.34 eV) were selected and donor encapsulation was performed on the SWNTs film by the above-mentioned ion implantation and vapor deposition/thermal annealing. The ion implantation was used for encapsulation of cesium and potassium. In the ion implantation, an alkali ion source was used and alkali metal ions generated from the source were injected into the SWNTs film at an accelerating voltage of 150V in a vacuum. Ion injection dose was measured by a time integral of ion current flowing into a SWNTs substrate. In the ion implantation, a temperature of the SWNTs film substrate was in a range between room temperature and 250° C. After the ion implantation was completed, thermal annealing was performed for several hours to complate encapsulation. For vapor deposition, the SWNTs substrate was placed in a vacuum apparatus and exposed to neutral alkali metal vapor generated from an alkali metal source which was electrically heated. A deposition amount was estimated by a current amount during electrical heating by using a calibration curve. After the vapor deposition, thermal annealing was performed for several hours to complete encapsulation. Finally, excessive alkali metal left on the SWNTs film was removed by cleaning with ethanol, toluene, and chloroform, in this order. Subsequently, as a donor to be further encapsulated, dimethylcobaltocene [η-($C_5H_3$)($CH_3$)$_2$]$_2$Co ($I_P$=4.9 eV) which was a kind of metallocene was selected. The SWNTs film was subjected to mixing or application of the encapsulated material and then to thermal annealing. Specifically, a saturated chloroform solution of dimethylcobaltocene was delivered by drops to the SWNTs film and thermal annealing was performed at 150° C. for 2 hours in the atmosphere. Next, after cooling, dimethylcobaltocene which was not encapsulated was removed by cleaning with ethanol, toluene, and chloroform in this order.

Figure 8:
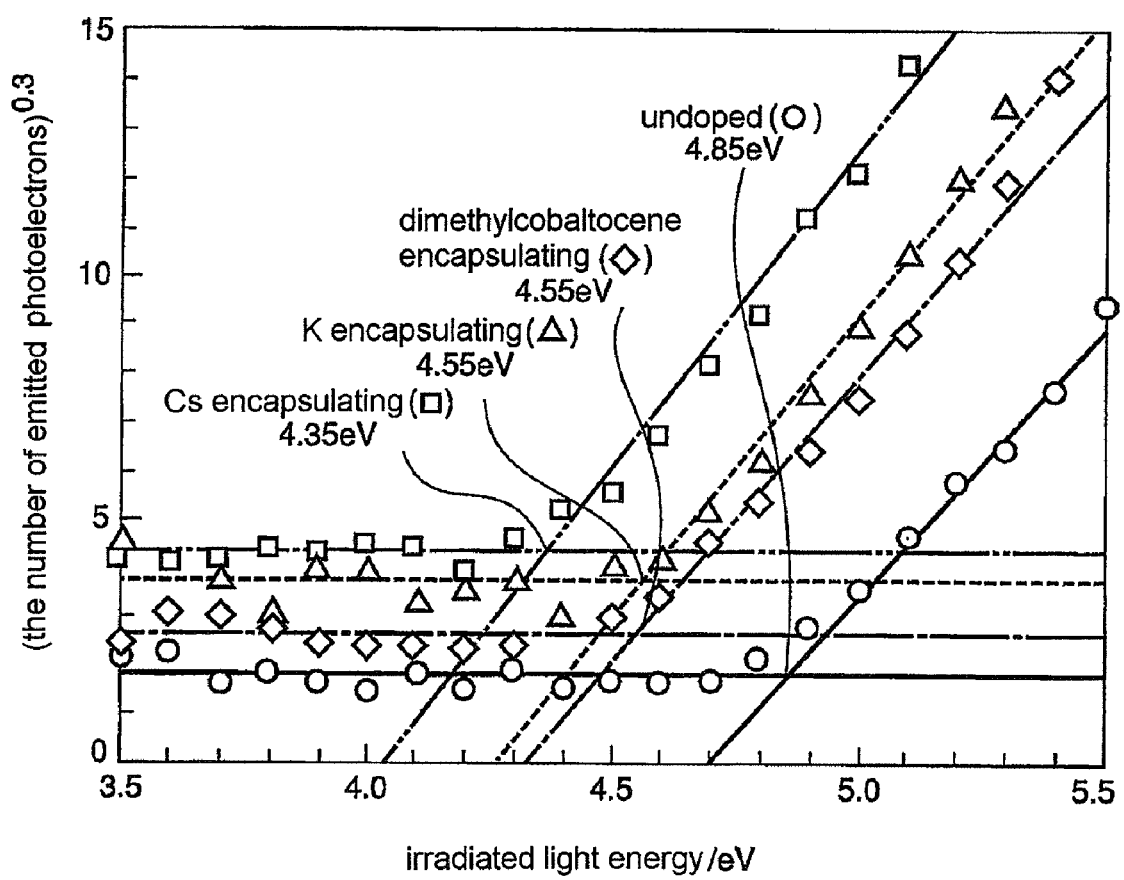
FIG. 8 shows atmospheric photoelectron spectra of SWNTs films encapsulating cesium, potassium, and dimethylcobaltocene, respectively.

For the SWNTs films encapsulating cesium, potassium, and dimethylcobaltocene, respectively, which were thus obtained, the work function was directly measured by using an atmospheric photoelectron spectrometer. The principle of atmospheric photoelectron spectroscopy is as follows. In the atmosphere, ultraviolet ray is irradiated with wavelength sweep performed. Emitted photoelectrons are captured in the form of negative oxygen ions, and electron counting is performed by an open counter. FIG. 8 shows atmospheric photoelectron spectra of the SWNTs films encapsulating cesium, potassium, and dimethylcobaltocene, respectively, which are manufactured by vapor deposition and thermal annealing. It is noted here that no essential difference in atmospheric photoelectron spectra was observed between the encapsulating SWNTs films manufactured by ion implantation and by vapor depositions for both cases of using cesium and potassium. This experimental fact means that the above-mentioned manufacturing processes are both effective for encapsulation. Further, even in case where the doped SWNTs film is left in the atmosphere at room temperature for 1 month or more, the atmospheric photoelectron spectrum does not exhibit time-dependent changes. Therefore, it is presumed that, when the doped SWNTs film is used as an electrode, no degradation problem will be caused. In the encapsulating SWNTs in FIG. 8, the doping amount of cesium in terms of the surface density is about $1 \times 10^{14}$ cm$^{-2}$, the doping amount of potassium is about $1 \times 10^{11}$ cm$^{-2}$, and the doping amount of dimethylcobaltocene is $1 \times 10^{15}$ cm$^{-2}$. An irradiation light energy at a rise of a spectral curve corresponds to a work function. A SWNTs film encapsulating nothing has a work function of 4.85 eV, while the SWNTs films encapsulating cesium, potassium, and dimethylcobaltocene have work functions of 4.35 eV, 4.55 eV, and 4.55 eV, respectively. Accordingly, work function shifts are minus 0.5 eV, minus 0.3 eV, and minus 0.3 eV, respectively. Considering a dopant surface density, these values are extremely close to the values predicted by the theoretical fitting curves in FIG. 6, shown in the first example. Further, in a SWNTs film doped with cesium in an amount not less than the single-layer closely-packed surface density, a work function value of about 3.0 eV is obtained, which is comparable to the work function (W=2.9 eV) of elemental calcium. This corresponds to the work function shift of minus 1.85 eV. Although this value does not reach minus 2.65 eV of the maximum work function shift in a case of the donor encapsulation illustrated in FIG. 5, the maximum shift value can be achieved by further optimizing the manufacturing method.

Fourth Example

Next, acceptor-encapsulating SWNTs were manufactured. As an acceptor to be encapsulated, iodine ($E_A$=3.08 eV) and $C_{60}F_{36}$ ($E_A$=3.48 eV) and $C_{60}F_{48}$ ($E_A$=4.06 eV) as fullerene fluoride were selected. Encapsulation of iodine was carried out in the following manner. SWNTs produced by laser ablation is mixed with iodine in an agate mortar and subjected to thermal annealing in a vacuum at 150° C. for 4 hours and further at 180° C. for 4 hours. Subsequently, the mixture was taken out into the atmosphere. Iodine which was not encapsulated was fully removed by cleaning with ethanol, toluene, and chloroform. Thereafter, suction filtration was performed by using a filter paper. Iodine-encapsulating SWNTs on the filter paper was transferred to a substrate, such as a SUS plate. Encapsulation of $C_{60}F_{36}$ and $C_{60}F_{48}$ were performed in the following manner. A saturated chloroform solution of $C_{60}F_{36}$ or $C_{60}F_{48}$ was delivered by drops to a SWNTs film substrate manufactured by the method similar to the first example. Thermal annealing was performed at 250° C. for 6 hours in a vacuum. Next, the SWNTs film substrate was taken out into the atmosphere. $C_{60}F_{36}$ and $C_{60}F_{48}$ which was were not encapsulated was were removed by cleaning with ethanol, toluene, and chloroform in this order. It is noted here that, even in case where the thermal annealing was performed in the atmosphere, an experimental result similar to that of the annealing in a vacuum was obtained.

Figure 9:
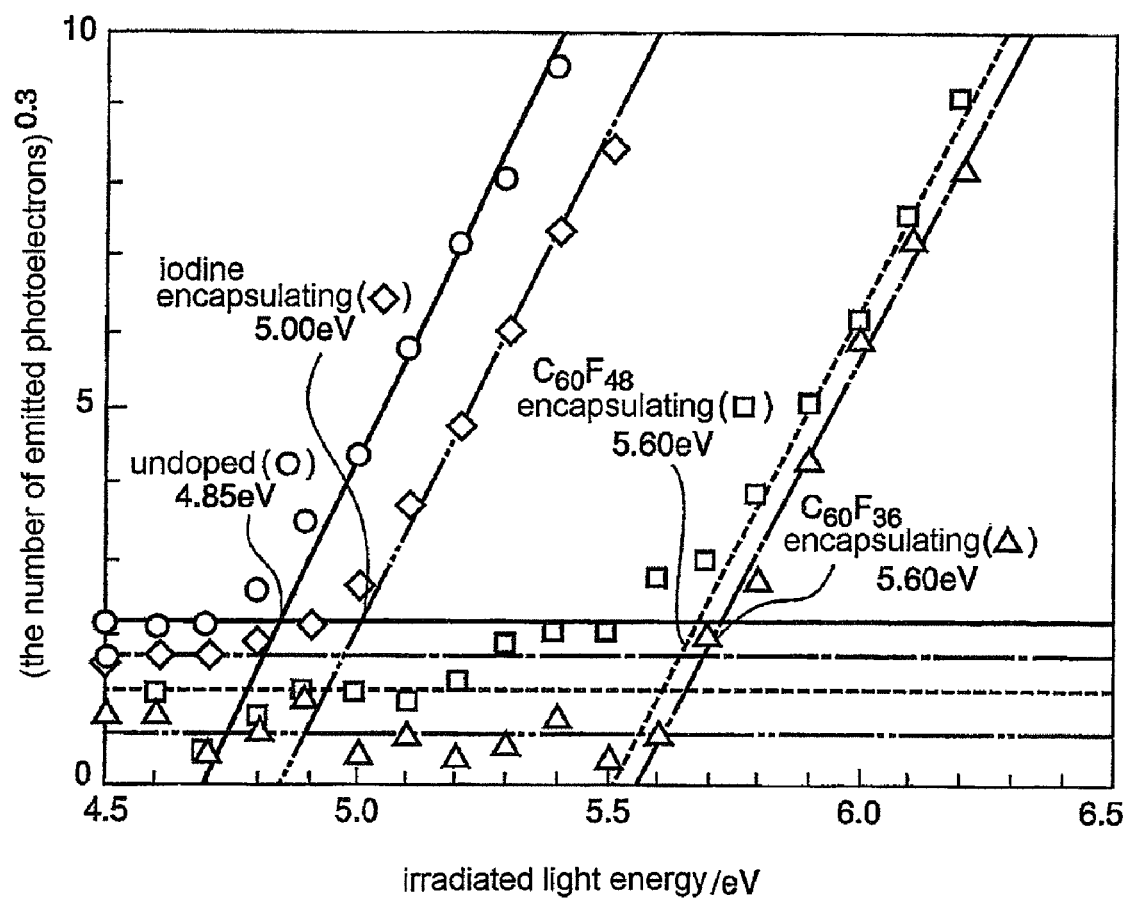
FIG. 9 shows atmospheric photoelectron spectra of SWNTs films encapsulating iodine, $C_{60}F_{36}$, and $C_{60}F_{48}$, respectively.

The iodine-, $C_{60}F_{36}$- and $C_{60}F_{48}$-encapsulating SWNTs films thus obtained were evaluated by an atmospheric photoelectron spectrometer in the manner similar to the third example. FIG. 9 shows photoelectron spectra of the iodine-, $C_{60}F_{36}$- and $C_{60}F_{48}$-encapsulating SWNTs films. It is noted here that, like in the case of donor encapsulation, even in case where the acceptor-encapsulating SWNTs film was left in the atmosphere at room temperature for 1 month or more, the atmospheric photoelectron spectrum did not exhibit time-dependent changes. This experimental fact suggests that, when the encapsulating SWNTs is used as an electrode, no degradation will be caused. In the samples in FIG. 9, dopant surface densities of iodine, $C_{60}F_{36}$, and $C_{60}F_{48}$ are about $1 \times 10^{10}$ cm$^{-2}$, $1 \times 10^{15}$ cm$^{-2}$, and $5 \times 10^{14}$ cm$^{-2}$, respectively. As shown in this figure, work functions of the iodine-, $C_{60}F_{36}$- and $C_{60}F_{48}$-encapsulating SWNTs films are 5.00 eV, 5.60 eV, and 5.60 eV, respectively. Therefore, work function shift of the iodine-encapsulating SWNTs film is plus 0.15 eV and is nearly coincident with the shift value predicted from the theoretical fitting curve shown in the second example. Work function shifts of the $C_{60}F_{36}$- and the $C_{60}F_{48}$-encapsulating SWNTs are plus 0.75 eV and plus 0.75 eV, respectively, which are values comparatively close to the maximum work function shift value: plus 1 eV, in the case of the acceptor encapsulation shown in FIG. 5. This experimental result supports the prediction shown in FIG. 5. Use of acceptors having a sufficiently high electron affinity enables achievement of the maximum work function shift value: plus 1 eV, of the acceptor-encapsulating SWNTs.

Fifth Example

An EL element manufactured by the above-mentioned manufacturing method and an EL element manufactured by the related art were compared in basic performance. For enabling the comparison, both of the EL elements were manufactured to be equivalent in element structure and size to each other, and compared to each other under identical measurement conditions. In both of the elements, poly-p-phenylenevinylene was used in common for a light-emitting layer. In the EL element of the present invention, a cesium-encapsulating SWNTs were used as a cathode and a $C_{60}F_{36}$-encapsulating SWNTs were used as an anode. On the other hand, in the EL element according to the related art, ITO was used as an anode and calcium was used as a cathode. Incidentally, a manufacturing method of the EL element of the related art will be described hereinunder. First, an ITO film was formed on a substrate by sputtering to form an anode having a sheet resistance of 20 Ω/sq. After an anode surface was subjected to UV-ozone cleaning, a toluene solution of poly-p-phenylenevinylene substituted by decyloxyphenyl under a nitrogen gas stream was applied by spin-coating and dried at 125° C. As a result, the light-emitting layer having a film thickness of 200 nm was obtained. Without exposure to the atmosphere, the substrate was put into a vacuum deposition apparatus to form a calcium film by a resistance heating method to the thickness of 30 nm. Thereafter, an aluminum layer having a film thickness of 100 nm was further formed as a cathode to thereby obtain an organic EL element. Characteristics of the element thus obtained and the element of the present invention are shown in Table 1.

TABLE 1

Comparison of Basic performance between EL elements of the present invention and the related art

|  | EL element of the present invention | EL element of the related art |
|---|---|---|
| Luminance [cd/m$^2$] ($V_{bias}$ = 5 V) | 401 | 103 |
| Light-emission starting voltage [V] | 2.60 | 3.40 |
| Maximum power efficiency [lm/W] | 13.7 ($V_{bias}$ = 3.5 V) | 5.5 ($V_{bias}$ = 4.0 V) |

The above table 1 shows comparison of performance between the EL elements of the present invention and the related art. When an applied voltage is 5V, the element of the present invention had a luminance of 401 cd/m$^2$ (candela/square meter) which was about four times as large as a luminance of 103 cd/m$^2$ of the element of the related art. The light-emission starting voltage was 2.60V in the present invention and 3.40V in the related art. Thus, it was observed that the light-emission starting voltage was obviously decreased in the present invention. Further, the maximum power efficiency was 13.7 lm/W (lumen/watt) in this invention and 5.5 lm/W in the related art. Thus, it was found that the element of the present invention was about 2.5 times higher than that of the related art. As described above, it was proved that the EL element utilizing the work function controlled SWNTs is remarkably improved in basic performance and has definite superiority to the EL element of the related art with respect to improvement of the luminous efficiency, low-voltage driving, and an increase in life.

INDUSTRIAL APPLICABILITY

As mentioned in the foregoing, the semiconductor device and the method of manufacturing the same are applicable to a semiconductor device for a display utilizing the EL element or the like, a lighting equipment utilizing the EL element, and the like, and also applicable to a transistor, a diode, an electrode and a wiring of a logic circuit, and so on.

This application claims priority based on Japanese Patent Application No. 2006-315050 filed on Nov. 22, 2006, the disclosure of which is incorporated herein in its entirety.

The invention claimed is:

1. A semiconductor device having a structure in which a light-emitting layer is sandwiched by a cathode and an anode, at least one of the cathode and the anode includes single-wall carbon nanotubes, each of the single-wall carbon nanotubes encapsulates a donor or an acceptor, and the light-emitting layer performs electroluminescence;

wherein the donor has an ionization potential lower than an effective intrinsic work function of the single-wall carbon nanotubes when the single-wall carbon nanotubes constitute the cathode, and each of the single-wall carbon nanotubes has the donor encapsulated therein so that the work function of the single-wall carbon nanotubes is adjusted to a LUMO energy level of a light-emitting material including in the light-emitting layer; and wherein the acceptor has an electron affinity higher than an effective intrinsic work function of the single-wall carbon nanotubes when the single-wall carbon nanotubes constitute the anode, and each of the single-wall carbon nanotubes has the acceptor encapsulated therein so that the work function of the single-wall carbon nanotubes is adjusted to a HOMO energy level of a light-emitting material including in the light-emitting layer.

2. The semiconductor device as claimed in claim 1, wherein the donor has an ionization potential lower than 6.4 eV (electron volt), the single-wall carbon nanotubes constituting the cathode.

3. The semiconductor device as claimed in claim 1, wherein the donor comprises one kind or two or more kinds of material selected from a group including a typical metal element, an alkali metal element, an alkaline earth metal element, a lanthanoid metal element, metallocenes, and a donor organic compound, the single-wall carbon nanotubes constituting the cathode.

4. The semiconductor device as claimed in claim 1, wherein the donor comprises one kind or two or more kinds of material selected from lithium (Li), sodium (Na), potassium (K), rubidium (Rb), cesium (Cs), calcium (Ca), strontium (Sr), barium (Ba), indium (In), aluminum (Al), gallium (Ga), yttrium (Y), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), lutetium (Lu), chromocene (($\eta$-$C_5H_5$)$_2$Cr), manganocene (($\eta$-$C_5H_5$)$_2$Mn), cobaltocene (($\eta$-$C_5H_5$)$_2$Co), nickelocene (($f$-$C_5H_5$)$_2$Ni), dimethylchromocene ([$\eta$-$C_5H_3(CH_3)_2$]$_2$Cr), dimethylmanganocene ([$\eta$-$C_5H_3(CH_3)_2$]$_2$Mn), dimethylcobaltocene ([$\eta$-$C_5H_3(CH_3)_2$]$_2$Co), dimethylnickelocene ([$\eta$-$C_5H_3(CH_3)_2$]$_2$Ni), decamethylchromocene ([$\eta$-$C_5(CH_3)_5$]$_2$Cr), decamethylmanganocene ([$\eta$-$C_5(CH_3)_5$]$_2$Mn), decamethylcobaltocene ([$\eta$-$C_5(CH_3)_5$]$_2$Co), decamethylferrocene ([$\eta$-$C_5(CH_3)_5$]$_2$Fe), decamethylnickelocene ([$\eta$-$C_5(CH_3)_5$]$_2$Ni), tetrakis(dimethylamino)ethylene (TDAE), N,N,N',N'-tetramethyl-para-phenylenediamine (TMPD), tetramethyltetraselenafulvalene (TMTSF), and tetrathiafulvalene (TTF), the single-wall carbon nanotube constituting the cathode.

5. The semiconductor device as claimed in claim 1, wherein the acceptor has an electron affinity higher than 2.3 eV, the single-wall carbon nanotube constituting the anode.

6. The semiconductor device as claimed in claim 1, wherein the acceptor comprises one kind or two or more kinds of material selected from a group including a halogen element, fullerenes, fullerene fluorides, endohedral fullerenes, superhalogens, and an acceptor organic compound, the single-wall carbon nanotube constituting the anode.

7. The semiconductor device as claimed in claim 1, wherein the acceptor comprises one kind or two or more kinds of material selected from a group including fluorine (F), chlorine (Cl), bromine (Br), iodine (I), $C_{60}$, $C_{70}$, $C_{74}$, $C_{76}$, $C_{78}$, $C_{80}$, $C_{82}$, $C_{60}F$, $C_{60}F_2$, $C_{60}F_{36}$, $C_{60}F_{48}$, $C_{70}F_2$, $C_{70}F_{52}$, Ca@$C_{60}$, La@$C_{74}$, Gd@$C_{60}$, Gd@$C_{74}$, Gd@$C_{76}$, Gd@$C_{78}$, Gd@$C_{80}$, Gd@$C_{82}$, $TaF_6$, $Ta_2F_{11}$, $Ta_3F_{16}$, $AlF_4$, $HfF_6$, $WF_6$, $ReF_6$, $OsF_6$, $IrF_6$, $PtF_6$, $AuF_6$, $HgF_6$, $AsF_6$, $SbF_6$, $TeF_7$, $WF_7$, $MnF_8$, $Al_2F_7$, $P_2F_{11}$, $V_2F_{11}$, $As_5F_{16}$, $Al_2Cl_7$, $PBr_6$, $Al_2Br_7$, tetrafluorocyano-para-quinodimethane ($F_4$TCNQ), 2,3-dichloro-5,6-dicyano-para-benzoquinone (DDQ), 7,7,8,8-tetracyanoquinodimethane (TCNQ), and tetrachloro-para-benzoquinone (para-chloranil), the single-wall carbon nanotubes constituting the anode.

8. The semiconductor device as claimed in claim 1, wherein the cathode or the anode is operated as a source electrode or a drain electrode of a thin film transistor (TFT) for driving.

9. An organic EL element comprising the semiconductor device claimed in claim 1.

10. An EL element comprising the semiconductor device claimed in claim 1.

* * * * *

UNITED STATES PATENT AND TRADEMARK OFFICE
CERTIFICATE OF CORRECTION

PATENT NO.       : 8,093,580 B2
APPLICATION NO.  : 12/515384
DATED            : January 10, 2012
INVENTOR(S)      : Hidefumi Hiura et al.

Page 1 of 1

It is certified that error appears in the above-identified patent and that said Letters Patent is hereby corrected as shown below:

In the Specification

Column 7, Line 20: After "so that" delete "a"

Column 11, Line 43: Delete "($\eta$-C$_5$H$_5$)$_2$ Cr" and insert -- ($\eta$-C$_5$H$_5$)$_2$Cr --

Column 14, Line 6: Delete "silicon/gold" and insert -- silicon --

Column 14, Line 41: Delete "([[~]]" and insert -- ( --

Column 16, Line 66: Delete "was were" and insert -- were --

Column 16, Line 67: Delete "was were" and insert -- were --

In the Claims

Column 19, Line 22: In Claim 4, delete "((f-" and insert -- (($\eta$- --

Signed and Sealed this
Second Day of September, 2014

Michelle K. Lee
*Deputy Director of the United States Patent and Trademark Office*